(12) United States Patent
Karda et al.

(10) Patent No.: US 10,943,915 B1
(45) Date of Patent: Mar. 9, 2021

(54) INTEGRATED MEMORY HAVING THE BODY REGION COMPRISING A DIFFERENT SEMICONDUCTOR COMPOSITION THAN THE SOURCE/DRAIN REGION

(71) Applicant: Micron Technology, Inc., Boise, ID (US)

(72) Inventors: Kamal M. Karda, Boise, ID (US); Albert Fayrushin, Boise, ID (US); Haitao Liu, Boise, ID (US); Kirk D. Prall, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 14 days.

(21) Appl. No.: 16/552,257

(22) Filed: Aug. 27, 2019

(51) Int. Cl.
*H01L 27/11553* (2017.01)
*H01L 27/11556* (2017.01)
*H01L 27/11582* (2017.01)

(52) U.S. Cl.
CPC .. *H01L 27/11556* (2013.01); *H01L 27/11582* (2013.01)

(58) Field of Classification Search
CPC ......... H01L 27/11553; H01L 27/11556; H01L 27/11563; H01L 27/11582
See application file for complete search history.

(56) References Cited

U.S. PATENT DOCUMENTS

2007/0228491 A1* 10/2007 Forbes ................ H01L 29/0673
257/401

* cited by examiner

*Primary Examiner* — Hoai V Pham
(74) *Attorney, Agent, or Firm* — Wells St. John P.S.

(57) ABSTRACT

Some embodiments include an assembly having a memory cell with an active region which includes a body region between a pair of source/drain regions. A charge-storage material is adjacent to the body region. A conductive gate is adjacent to the charge-storage material. A hole-recharge arrangement is configured to replenish holes within the body region during injection of holes from the body region to the charge-storage material. The hole-recharge arrangement includes a heterostructure active region having at least one source/drain region of a different composition than the body region, and/or includes an extension coupling the body region with a hole-reservoir. A wordline is coupled with the conductive gate. A first comparative digit line is coupled with one of the source/drain regions, and a second comparative digit line is coupled with the other of the source/drain regions.

40 Claims, 12 Drawing Sheets

US 10,943,915 B1

1

INTEGRATED MEMORY HAVING THE BODY REGION COMPRISING A DIFFERENT SEMICONDUCTOR COMPOSITION THAN THE SOURCE/DRAIN REGION

TECHNICAL FIELD

Integrated memory.

BACKGROUND

Memory is one type of integrated circuitry and is used in computer systems for storing data. Memory may be fabricated in one or more arrays of individual memory cells. Memory cells may be written to, or read from, using digit lines (which may also be referred to as bitlines, data lines, sense lines, or data/sense lines) and access lines (which may also be referred to as wordlines). The digit lines may conductively interconnect memory cells along columns of the array, and the access lines may conductively interconnect memory cells along rows of the array.

Memory cells may be volatile or nonvolatile. Nonvolatile memory cells can store data for extended periods of time including when the computer is turned off. Volatile memory dissipates and therefore requires being refreshed/rewritten, sometimes multiple times per second. Regardless, memory cells are configured to retain or store memory in at least two different selectable states. In a binary system, the states are considered as either a "0" or a "1". In other systems, at least some individual memory cells may be configured to store more than two levels or states of information.

It is desired to develop improved memory cells.

BRIEF DESCRIPTION OF THE DRAWINGS

FIGS. 10B and 10C are diagrammatic cross-sectional side views along the lines B-B and C-C, respectively of FIG. 10A. FIG. 10A is a diagrammatic cross-sectional top-down view along the lines A-A of FIGS. 10B and 10C. FIG. 10B is along the line B-B of FIG. 10C. FIG. 10C is along the C-C of FIG. 10B.

DETAILED DESCRIPTION OF THE ILLUSTRATED EMBODIMENTS

Some embodiments include recognition that body regions associated with some types of memory cells may be "float-

2 ing", and thus may be isolated from a source of carrier. Such can become problematic during programming operations, in that a limiting factor in the speed of the programming operations may be the rate at which carriers are refreshed within the body regions. Some embodiments may include heterostructure active regions which enable inter-band tunneling during replenishment of carrier to thereby improve performance (e.g., to increase programming speed). Some embodiments may include structures which couple the body regions with a reservoir of carrier. Example embodiments are described with reference to FIGS. 1-10.

As a preliminary matter, it is noted that some of the figures show various different dopant levels; and utilize some or all of the designations p+, p, p−, n−, n and n+ to distinguish the levels. The difference in dopant concentration between the regions identified as being p+, p, and p− are typically as follows: a p+ region has a dopant concentration of at least about $10^{20}$ atoms/cm$^3$, a p region has a dopant concentration of from about $10^{14}$ to about $10^{18}$ atoms/cm$^3$, and a p− region has a dopant concentration of less than or equal to about $10^{16}$ atoms/cm$^3$. Regions identified as being n−, n and n+ will have dopant concentrations similar to those described above relative to the p−, p and p+ regions respectively, except, of course, the n regions will have an opposite-type conductivity-enhancing dopant therein than do the p regions. It is noted that the terms "p" and "n" can be utilized herein to refer to both dopant type and relative dopant concentrations. The terms "p" and "n" are to be understood as referring only to dopant type, and not to a relative dopant concentration, except when it is explicitly stated that the terms refer to relative dopant concentrations. Accordingly, for purposes of interpreting this disclosure and the claims that follow, it is to be understood that the terms "p-type doped" and "n-type doped" refer to dopant types of a region and not to relative dopant levels. Thus, a p-type doped region can be doped to any of the p+, p, and p− dopant levels discussed above, and similarly an n-type doped region can be doped to any of the n+, n, and n− dopant levels discussed above.

Figure 1:
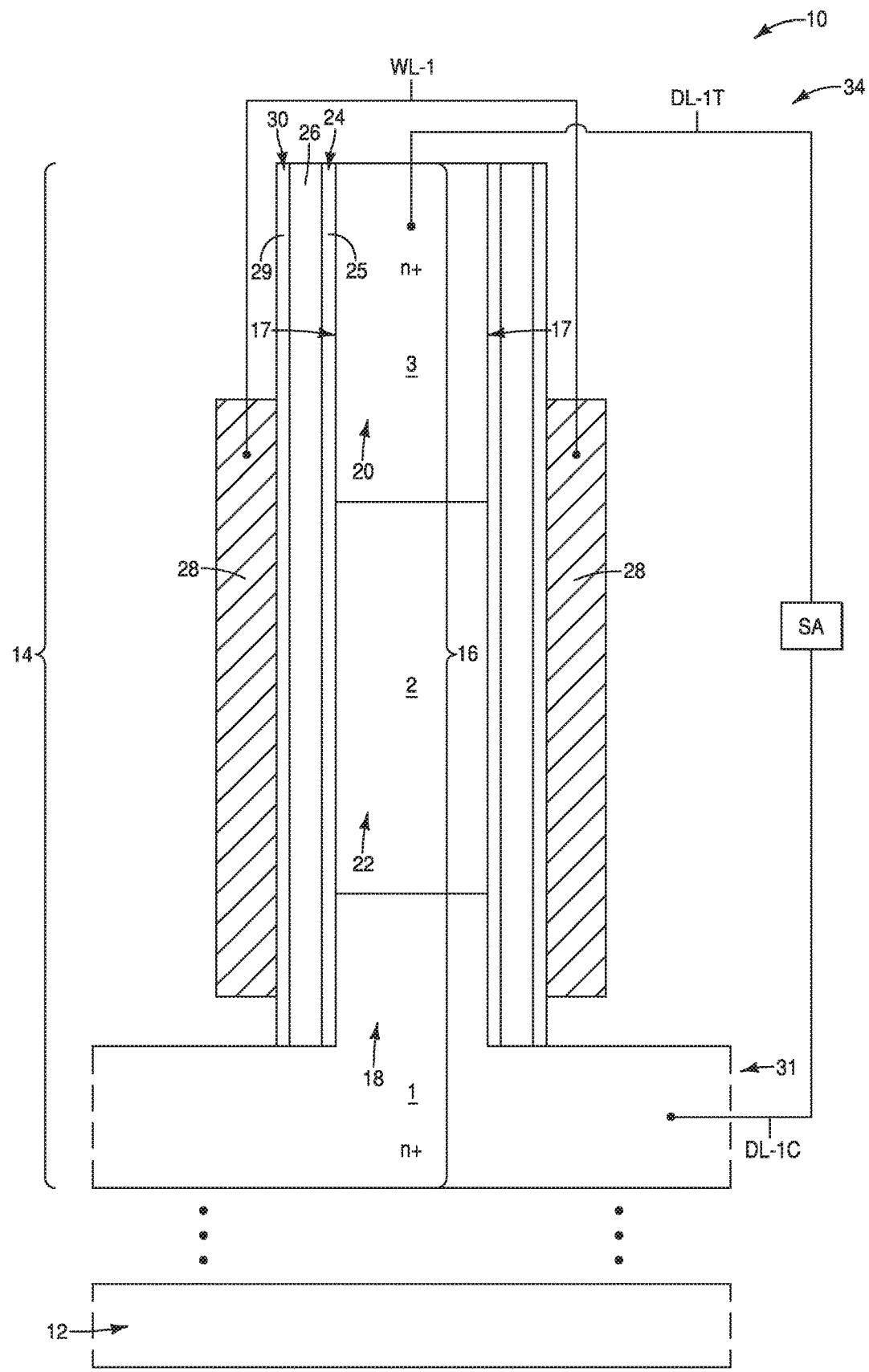
FIG. 1 is a diagrammatic cross-sectional side view of a region of an example integrated assembly.

Referring to FIG. 1, an integrated assembly 10 includes a memory cell 14 supported by a base 12.

The base 12 may comprise semiconductor material; and may, for example, comprise, consist essentially of, or consist of monocrystalline silicon. The base 12 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 12 may correspond to a semiconductor substrate containing one or more materials associated with integrated circuit fabrication. Such materials may include, for example, one or more of refractory metal materials, barrier materials, diffusion materials, insulator materials, etc.

A gap is provided between the base 12 and the memory cell 14 to indicate that there may be other materials, circuit components, etc., provided between the base 12 and the memory cell 14 in some embodiments.

The memory cell 14 comprises an active region 16. The active region includes a first (or lower) source/drain region 18, a second (or upper) source/drain region 20, and a body region (or channel region) 22 between the source/drain regions 18 and 20. In the illustrated embodiment, the active region 16 extends vertically relative to the base 12. Thus, the source/drain regions 18 and 20 are vertically opposed (disposed, arranged) relative to one another. In other embodiments, the active region may have a different configuration relative to the base 12. For instance, the source/drain regions may be horizontally opposed (disposed, arranged) relative to one another.

The active region 16 comprises semiconductor material and is a heterostructure configuration; with the term "heterostructure configuration" meaning that at least one of the source/drain regions 18 and 20 is different in semiconductor composition relative to the body region 22. In some embodiments, both of the source/drain regions 18 and 20 are different in semiconductor composition relative to the body region 22. In the shown embodiment, the first source/drain region 18 comprises a semiconductor composition "1", the body region 22 comprises a semiconductor composition "2", and the second source/drain region 20 comprises a semiconductor composition "3".

The semiconductor compositions 1, 2 and 3 may be any suitable compositions; and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). The source/drain semiconductor compositions 1 and 3 may be the same as one another in some embodiments, and may be different relative to one another in other embodiments.

The memory cell 14 includes a first insulative region 24 extending along the body region 22, includes charge-storage material 26 adjacent the first insulative region, includes a second insulative region 30 adjacent the charge-storage material, and includes conductive gate material 28 adjacent the second insulative region 30.

The insulative region 24 is shown to comprise a single homogenous composition 25. In some embodiments, the composition 25 may comprise, consist essentially of, or consist of silicon dioxide or a high-k material (e.g., hafnium oxide, zirconium oxide, etc.), where the term "high-k" means a dielectric constant greater than that of silicon dioxide (greater than about 3.9). In some embodiments, the insulative region 24 may be "bandgap- engineered", and may comprise two or more compositions arranged in a laminate (as described in more detail below with reference to FIG. 8). In some embodiments, the insulative region 24 may be omitted (as described in more detail below with reference to FIG. 9).

The charge-storage material 26 may comprise, for example, silicon (e.g., polysilicon), a continuous layer of metal, silicon oxynitride, silicon nitride, metallic nanodots, etc. The polysilicon is sometimes considered to be an example of a floating gate material, whereas the silicon nitride and metallic nanodots would be considered to be examples of charge-trapping materials. The polysilicon may include polycrystalline silicon, and may also include amorphous silicon.

The insulative region 30 is shown to comprise a single homogenous composition 29. In some embodiments, the composition 29 may comprise, consist essentially of, or consist of silicon dioxide or a high-k material (e.g., hafnium oxide, zirconium oxide, etc.). In some embodiments, the insulative region 30 may comprise two or more compositions arranged in a laminate. The composition 29 may be referred to as a second insulative composition to distinguish it from the first insulative composition 25.

The conductive gate material 28 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive gate material 28 may be a metal-containing material; such as, for example, a material comprising one or more of titanium nitride, tungsten nitride, tungsten, titanium, etc.

In the shown embodiment, the vertically-extending active region 16 has a pair of opposing sidewalls 17 along the cross-section of FIG. 1. The sidewalls 17 extend along the body region 22, the upper source/drain region 20, and an upper portion of the lower source/drain region 18. In the shown embodiment, the lower source/drain region 18 is along a conductive line 31 that extends along the plane of the cross-section of FIG. 1, with only a portion of such conductive line being shown. The conductive line may be part of a digit line.

The first insulative material 25 is adjacent the opposing sidewalls 17, and extends along the sidewalls 17. The charge-storage material 26, second insulative material 29 and conductive gate material 28 may also be considered to be along the sidewalls 17. The materials 25, 26, 28 and 29 may have any suitable vertical dimensions relative to the illustrated active region 16. The insulative region 24 may extend along the entirety of the sidewalls 17, or may extend along only portions of such sidewalls. The charge-storage material 26 and the insulative region 30 may extend vertically beyond the conductive gate material 28 (as shown), and in other embodiments (not shown) may not extend vertically beyond the conductive gate material. The conductive gate material may overlap interfaces where the body region 22 joins to the source/drain regions 18 and 20, as shown.

The memory cell 14 may be representative of many substantially identical memory cells of a memory array 34 (with the term "substantially identical" meaning identical to within reasonable tolerances of fabrication and measurement). In such applications, the conductive gate material 28 may be coupled with a wordline WL-1, the upper source/drain region 20 may be coupled with a first comparative digit line DL-1T, and the lower source/drain region 18 may be coupled with a second comparative digit line DL-1C. The comparative digit lines DL-1T and DL-1C extend to a sense amplifier SA. The comparative digit lines DL-1T and DL-1C may be considered to correspond to a set of paired digit lines (DL-1T/DL-1C). The set comprises a true digit line (DL-1T) and a complementary digit line (DL-1C). The terms "true" and "complementary" are arbitrary. The electrical values of the true and complementary digit lines of the set are utilized together during reading/writing operations of memory cells (e.g., 14) associated with such set. In some embodiments, the true comparative digit line (DL-1T) may be referred to as a first comparative digit line, and the complementary comparative digit line (DL-1C) may be referred to as a second comparative digit line.

The source/drain regions 18 and 20 are shown to be heavily-doped with n-type dopant (specifically, are labeled as "n+" regions). Accordingly, the memory cell 14 is an n-channel device. The body region 22 may or may not be doped; and if doped may be doped to any suitable dopant type/level. For instance, the body region 22 may be doped to an intrinsic level, a "p−" level, a "p" level, a "p+" level, an "n−" level, etc., relative to the illustrated embodiment in which the memory cell 14 is an n-channel device.

The n-channel memory cell 14 may be programmed into a first memory state (a so-called "1" state) by operating the wordline WL-1 and the digit line set DL-1T/DL-1C to provide electrons from the active region 16 into the charge-storage material 26. The memory cell 14 may be programmed into a second memory state (a so-called "0" state) by operating the wordline WL-1 and the digit line set DL-1T/DL-1C to inject holes from the body region 22 into the charge-storage material 26.

Figure 2:
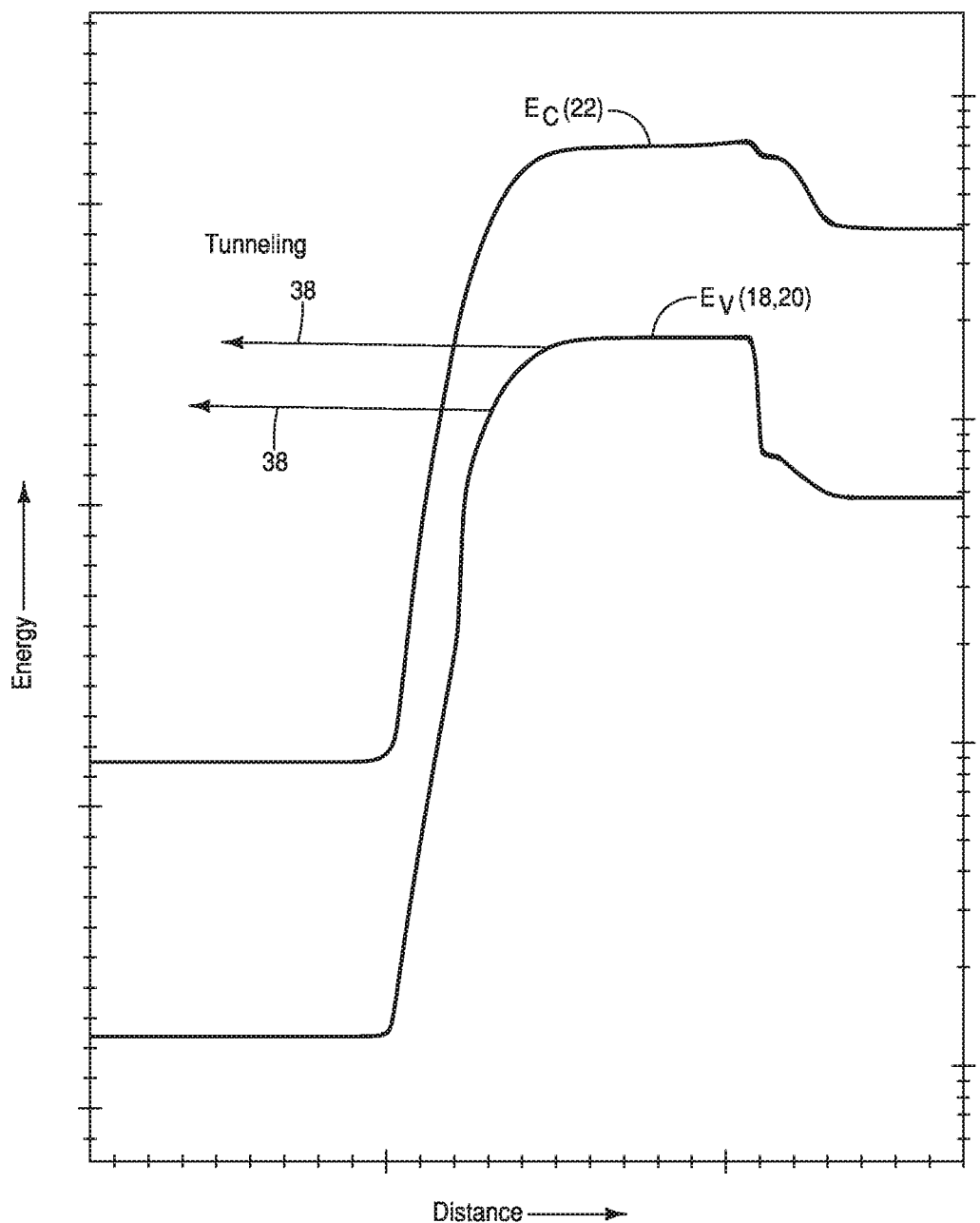
FIG. 2 graphically illustrates tunneling between the energy of a valence band of one material and the energy of a conductive band of an adjacent material in an example embodiment.

Some embodiments described herein are configured to provide efficient routes for replenishing the holes within the body region 22 during programming operations. For instance, the heterostructure configuration of the active region 16 can enable inter-band tunneling between the body region 22 and an adjacent source/drain region to enable the replenishment of the holes within the body region. FIG. 2 graphically illustrates the energy level of a conduction band ($E_C$) of a semiconductor composition within the body region 22, and the energy level of a valence band ($E_V$) of a semiconductor composition within one or both of the source/drain regions 18 and 20. When suitable voltage bias is applied, such can enable carrier (e.g., holes) to tunnel from at least one of the source/drain regions to the body region, with such tunneling being diagrammatically illustrated with the arrows 38. In some embodiments, the semiconductor material within the body region 22 may comprise Ge or GeSi, (where the chemical formula indicates primary constituents rather than a specific stoichiometry); and the semiconductor material within the adjacent source/drain region may comprise Si.

Although the memory cell 14 is shown and described as an n-channel device, in other embodiments it may be a p-channel device. In such other embodiments, the same considerations discussed above will apply, except that it will be the electrons which are replenished through inter-band tunneling. In some embodiments, the source/drain regions 18 and 20 may be considered to be heavily-doped to a first conductivity type, and the heterostructure configuration of the active region 16 may be considered to enable replacement of carrier of a second conductivity type within the body region through inter-band tunneling between the body region and an adjacent source/drain region; with one of the first and second conductivity types being p-type and the other being n-type.

The active region 16 may have any suitable heterostructure configuration. In some example embodiments, the n-channel memory cell 14 may have a body region 22 which comprises germanium with or without silicon, and may have source/drain regions 18 and 20 which include silicon with or without germanium. The germanium concentration within the body region 22 may be higher than any germanium concentration within either of the first and second source/drain regions 18 and 20. In some example embodiments, the germanium concentration within the body region 22 may be within a range of from about 10 atomic percent to about 100 atomic percent; and the germanium concentration within the source/drain regions 18 and 20 may be within a range of from about 0 atomic percent to about 50 atomic percent. The source/drain regions 18 and 20 may be the same semiconductor composition as one another, or not. In some embodiments, a mixture of silicon and germanium may be referred to as Si/Ge, where "Si/Ge" indicates that silicon is present with germanium and does not imply any particular stoichiometry.

In some embodiments, the first and second comparative digit lines DL-1T and DL-1C are together a paired set DL-1T/DL-1C which may be representative of many substantially identical paired sets of first and second comparative digit lines across the memory array 34 (FIG. 1); and the wordline WL-1 may be representative of many substantially identical wordlines across the memory array. An example memory array is described with reference to FIG. 3.

The example memory array 34 includes a plurality of the memory cells 14. Wordlines WL-1 and WL-2 are coupled with a wordline driver (Driver), and extend along rows of the memory array. Digit line pairs DL-1T/DL-1C and DL-2T/DL-2C extend along columns of the memory array. Each of the memory cells 14 is uniquely addressed through a combination of one of the wordlines and one of the sets of the first and second comparative digit lines.

Figure 3:
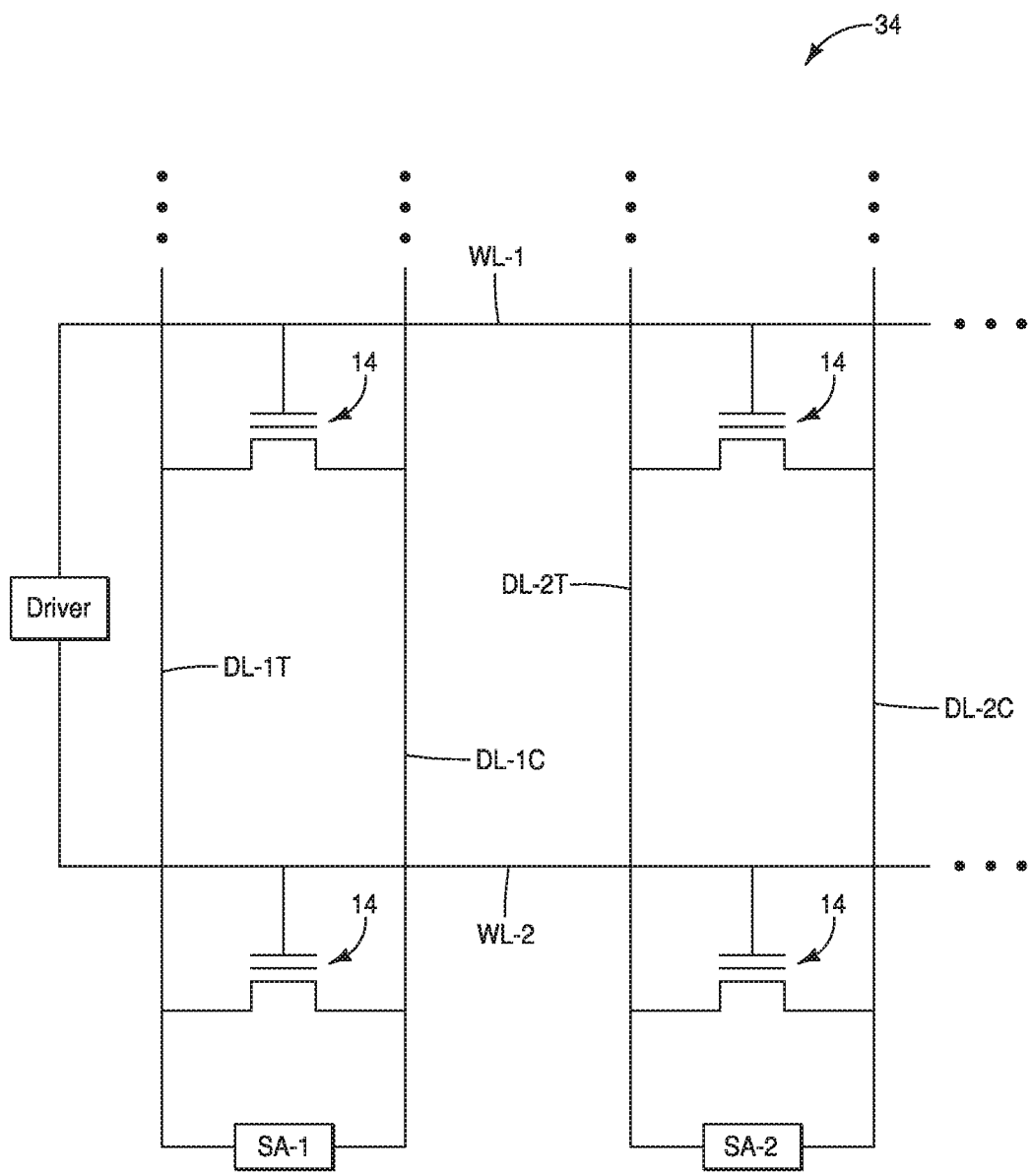
FIG. 3 is a schematic view of a region of an example memory array.

The true and complementary comparative digit lines (e.g., DL-1T and DL-1C) of each of the paired digit line sets (e.g., DL-1T/DL-1C) are electrically coupled with a sense amplifier (shown in FIG. 3 as SA-1 and SA-2). A sense amplifier may be utilized to compare electrical properties of a true digit line (e.g., DL-1T) with those of a comparative digit line (e.g., DL-1C) during a READ operation. Alternatively, or additionally, a sense amplifier may be utilized to impart desired electrical properties to the true and complementary comparative digit lines (e.g., DL-1T and DL-1C) during a programming (i.e., WRITE) operation.

Figure 4:
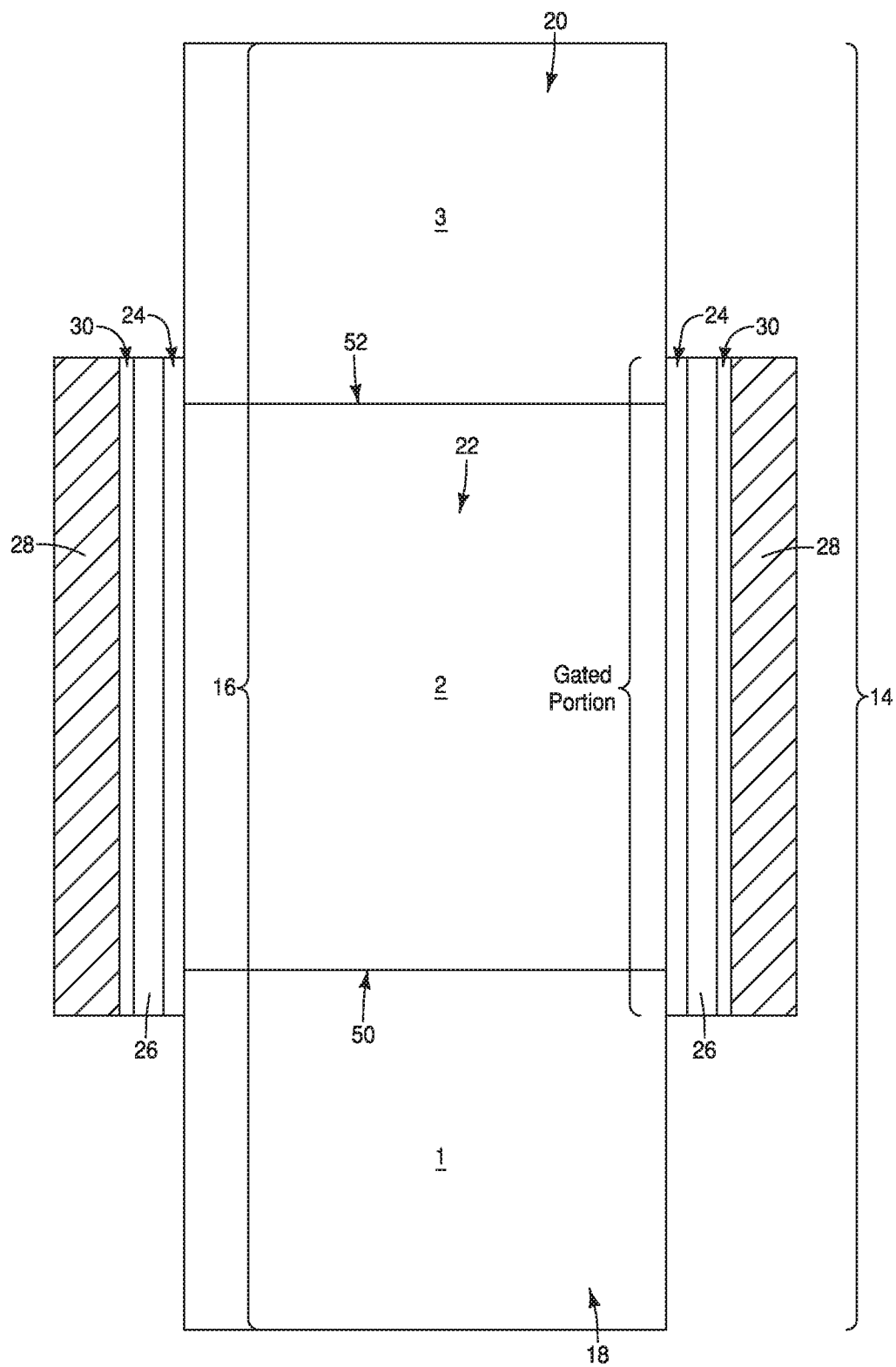
FIG. 4 is a diagrammatic cross-sectional side view of a region of an example assembly.

FIG. 1 shows the memory cell 14 having only a portion of the active region 16 vertically overlapped by the conductive gate material 28. In some embodiments, the portion of the active region 16 overlapped by the conductive gate material 28 may be referred to as a gated portion of the active region 16, and other portions of the active region 16 be referred to as non-gated portions. FIG. 4 shows a region of an example memory cell 14 having a gated portion. The illustrated region of the memory cell comprises the body region 22, and the source/drain regions 18 and 20; with the body region comprising the semiconductor composition 2, and the source/drain regions 18 and 20 comprising the semiconductor compositions 1 and 3. The gated portion overlaps an interface 50 between the semiconductor compositions 1 and 2, and also overlaps an interface 52 between the semiconductor compositions 2 and 3. The interfaces 50 and 52 may be referred to as first and second transition regions, respectively; and correspond to regions where the semiconductor material of the body region 22 transitions to the semiconductor material of the source/drain regions 18 and 20, respectively.

Figure 5:
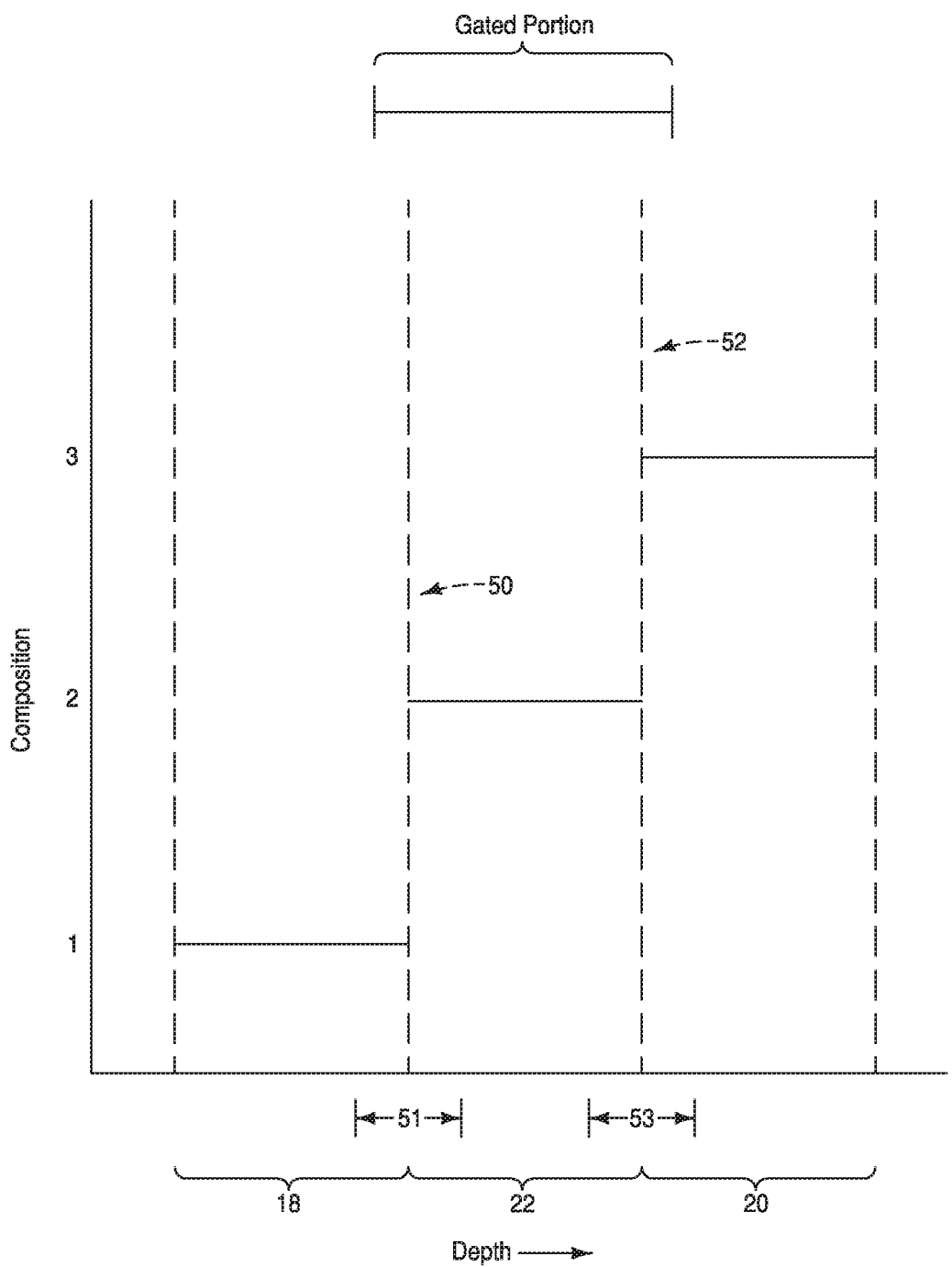
FIG. 5 is a graphical view of composition versus depth for a portion of the assembly of FIG. 4.

In some embodiments, the interfaces 50 and 52 may comprise abrupt transitions from the semiconductor composition of the body region 22 (i.e., the composition 2) to the semiconductor compositions of the source/drain regions 18 and 20 (i.e., the compositions 1 and 3). FIG. 5 graphically illustrates such abrupt transitions. Specifically, FIG. 5 shows an abrupt transition from composition 1 to composition 2 along the interface 50, and shows another abrupt transition from composition 2 to composition 3 along the interface 52. The term "abrupt transition" may be understood to mean a transition which occurs across a very short distance; which may include, but is not limited to, transitions in which there is no mixing of adjacent compositions across the interface. FIG. 5 shows distances 51 and 53 which may correspond to regions where compositions mix across the interfaces 50 and 52 relative to the illustrated abrupt transitions occurring at such interfaces. In some embodiments, the distances 51 and 53 may be less than or equal to about 50 Å, less than or equal to about 30 Å, less than or equal to about 20 Å, etc., for the abrupt transitions described herein.

In the illustrated embodiment of FIG. 5 both of the abrupt transitions corresponding to interfaces 50 and 52 are within the gated portion of the active region 16.

Figure 6:
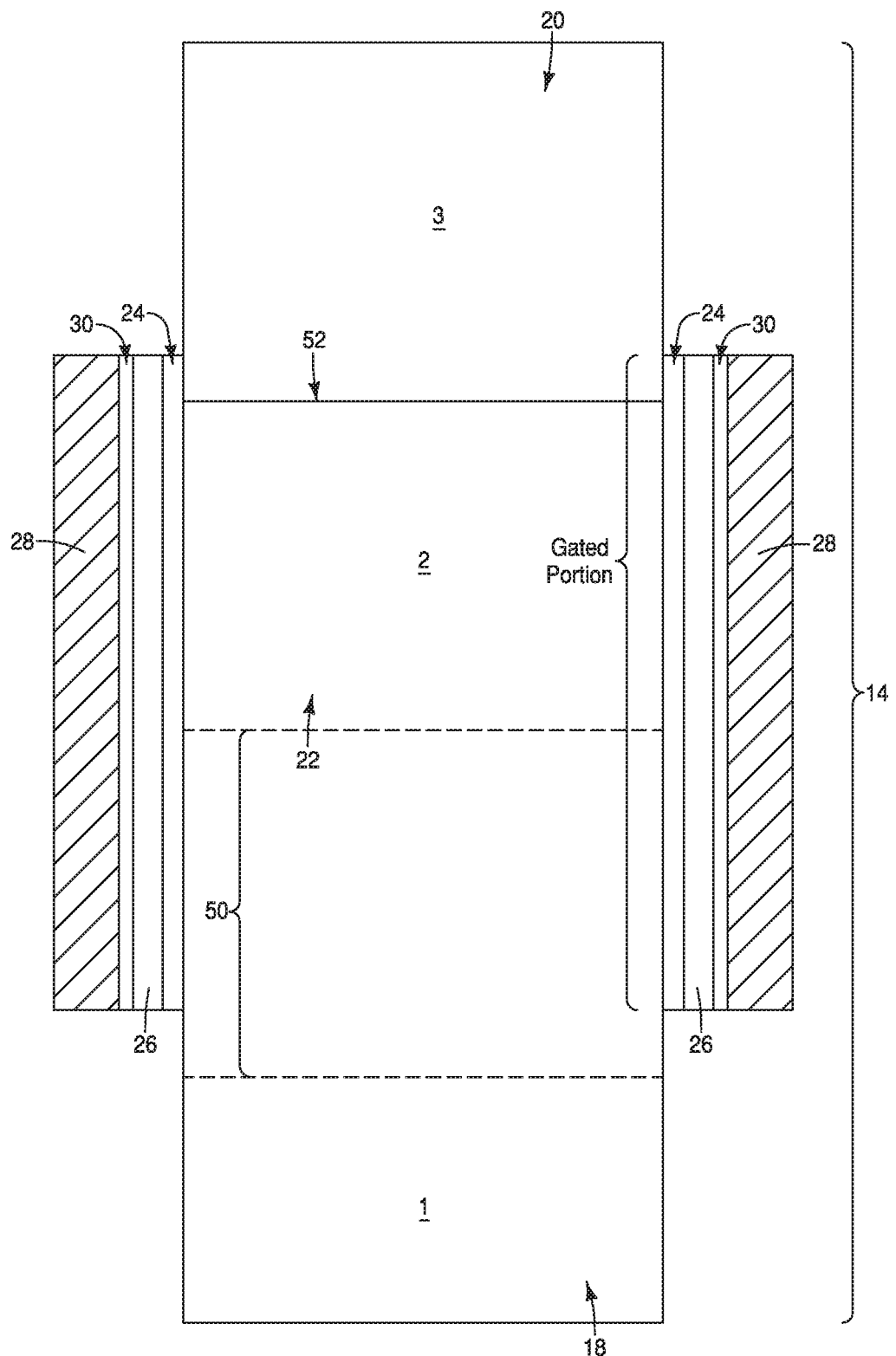
FIG. 6 is a diagrammatic cross-sectional side view of a region of an example assembly.
Figure 7:
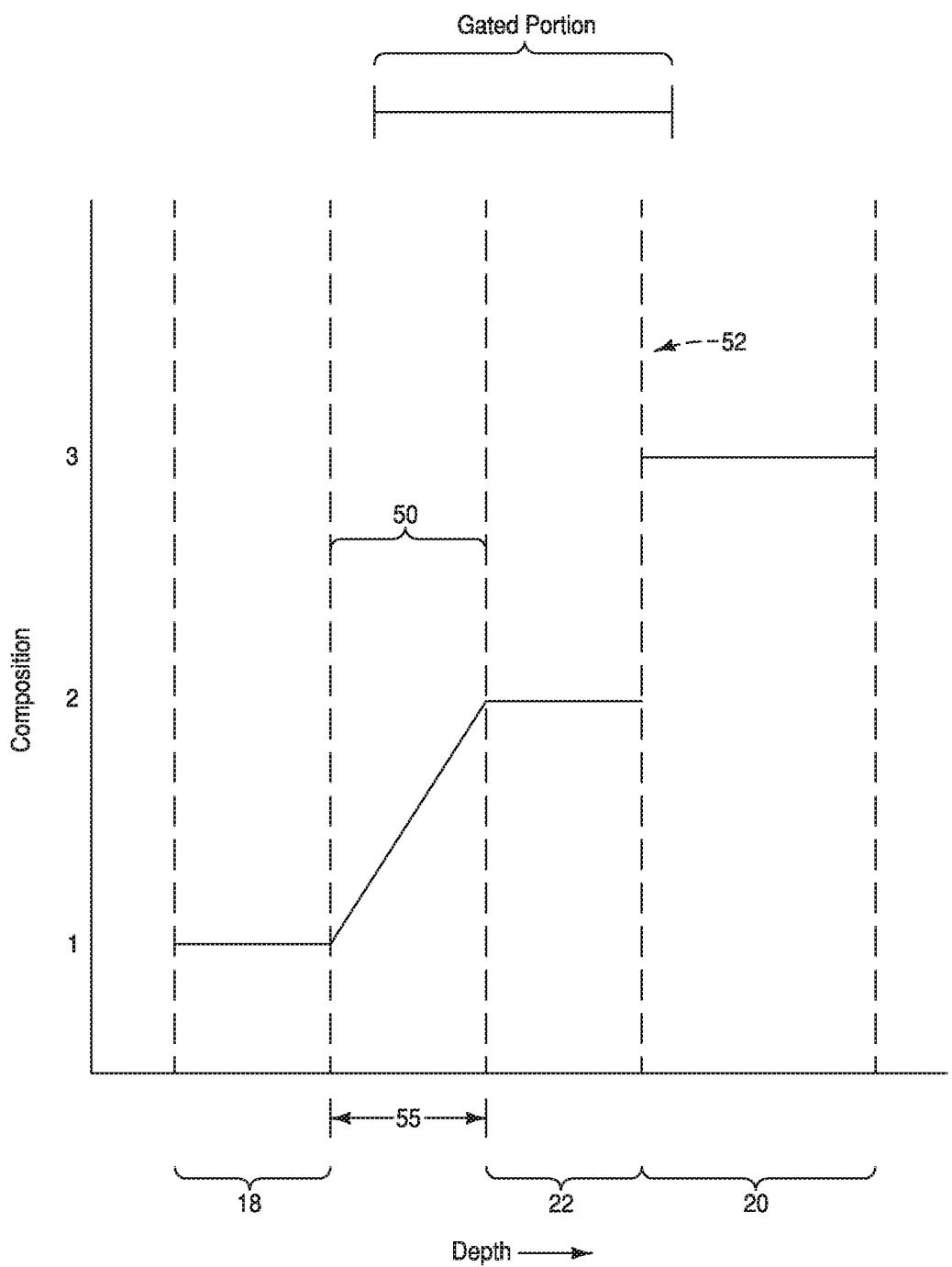
FIG. 7 is a graphical view of composition versus depth for a portion of the assembly of FIG. 6.

In some embodiments, at least one of the interfaces 50 and 52 may be a graded transition. For instance, FIGS. 6 and 7 show a graded transition along the interface 50 and an abrupt transition along the interface 52. In in the shown embodiment, the abrupt transition is within the gated portion of the active region 16; and part of the graded transition is within the gated portion while another part is not within the gated portion. FIG. 7 shows the graded transition 50 occurring over a distance 55, with part of such distance being within the gated portion and another part being outside of the gated portion. The distance 55 may correspond to a distance across which the composition 1 of the source/drain region 18 mixes with the composition 2 of the body region 22.

The term "graded transition" means a transition occurring over a relatively long distance as compared to the relatively short distance of the abrupt transition. In some embodiments, a graded transition may occur over a distance of at least about 100 Å, at least about 200 Å, at least about 500 Å, etc.

Figure 8:
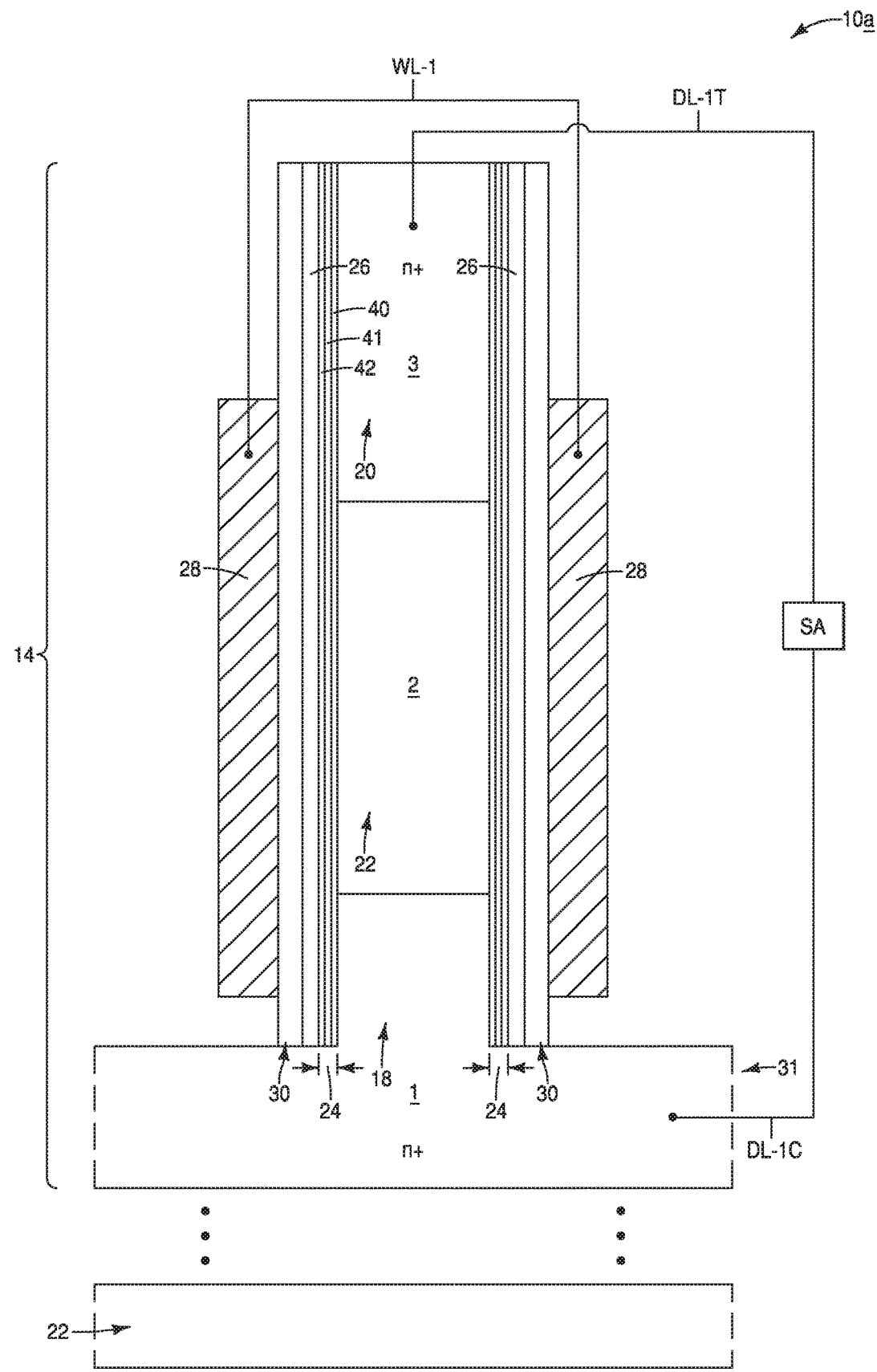
FIG. 8 is a diagrammatic cross-sectional side view of a region of an example integrated assembly.

As mentioned above relative to the description of FIG. 1, the insulative regions 24 and 30 may comprise a single homogeneous composition, or may comprise two or more different compositions. FIG. 8 shows a memory cell 10a analogous to the memory cell 10 of FIG. 1, but in which the insulative region 24 comprises a laminate of multiple compositions 40, 41 and 42. The materials 40, 41 and 42 may be bandgap-engineered to achieve desired electrical properties. In some embodiments, the materials 40, 41 and 42 may comprise silicon dioxide, silicon nitride (or silicon oxynitride) and silicon dioxide, respectively. In other embodiments, the materials 40, 41 and 42 may comprise other compositions (for instance, one or both of the materials 40 and 42 may comprise high-k material). Also, in other embodiments there may be more than three discrete materials within the bandgap-engineered insulative region 24, or fewer than three discrete materials within such bandgap-engineered insulative region.

The insulative region 30 may or may not be bandgap-engineered analogously to the insulative region 24. Accordingly, in some embodiments the insulative region 30 may comprise multiple different compositions in a laminate configuration analogous to the configuration shown in FIG. 8 relative to the insulative region 24.

Figure 9:
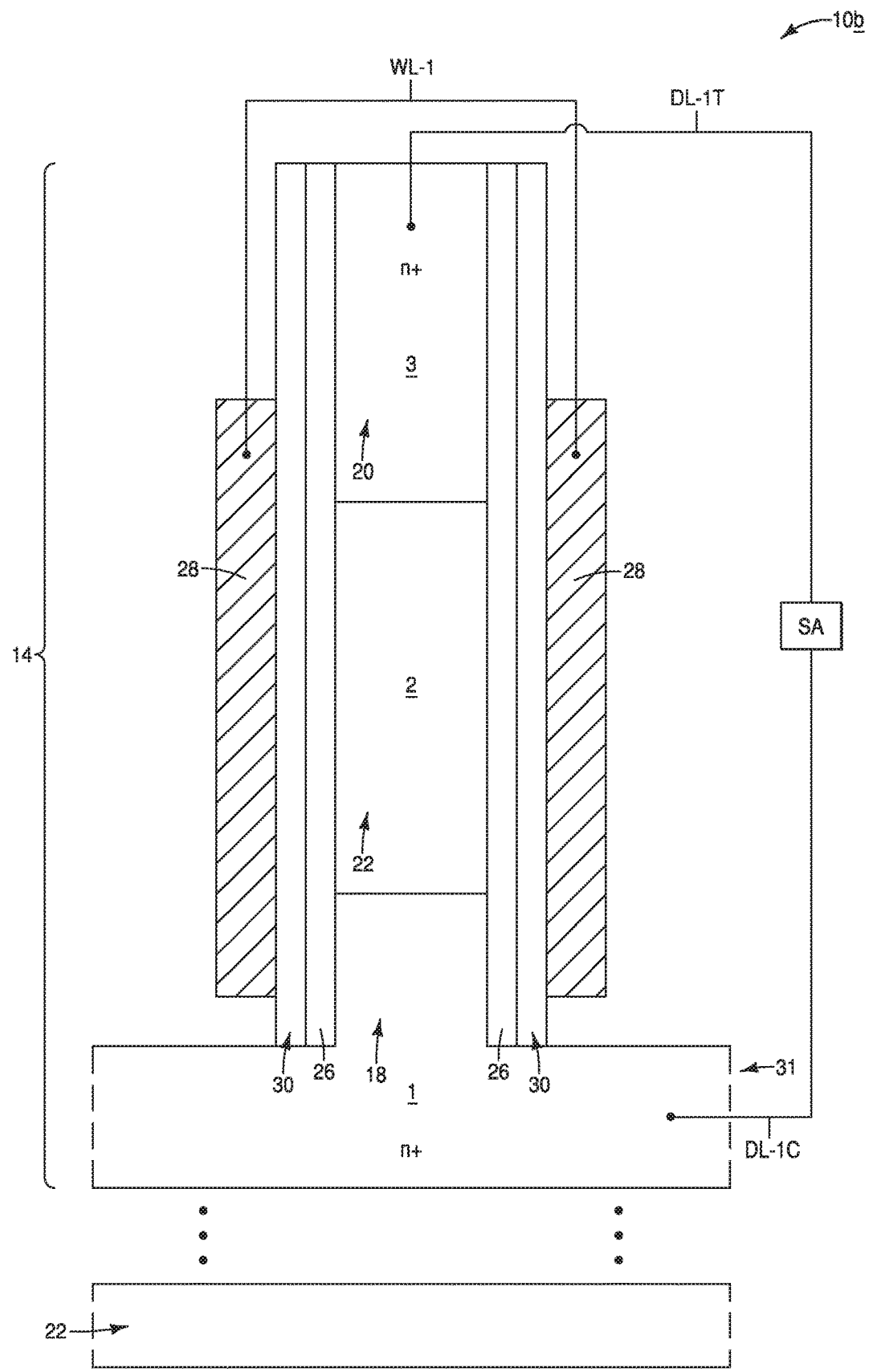
FIG. 9 is a diagrammatic cross-sectional side view of a region of an example integrated assembly.

In some embodiments, the insulative region 24 may be omitted, as shown relative to a memory cell 10b in FIG. 9.

The heterostructure active region configuration of FIG. 1 is an example of a hole-recharge arrangement configured to replenish holes within the body region 22 during injection of holes from the body region to the charge-storage material 26. Another example hole-recharge arrangement is described with reference to FIGS. 10A-10C.

Figure 10A:
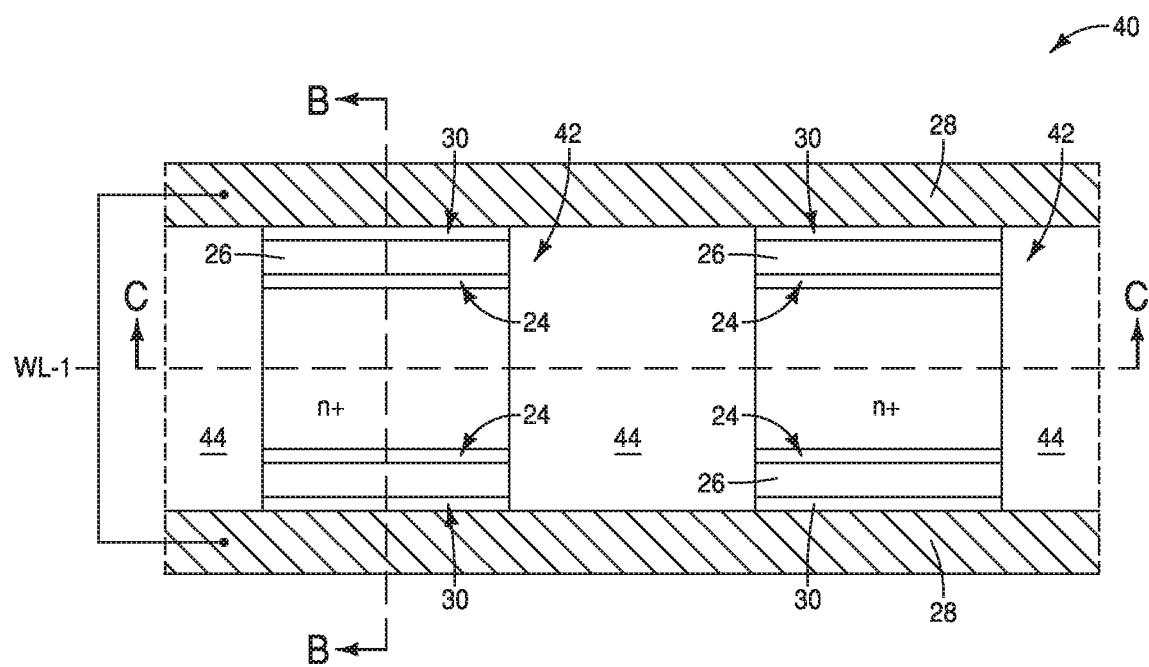
FIGS. 10A, 10B and 10C are diagrammatic cross-sectional views of a region of an example integrated assembly.
Figure 10B:
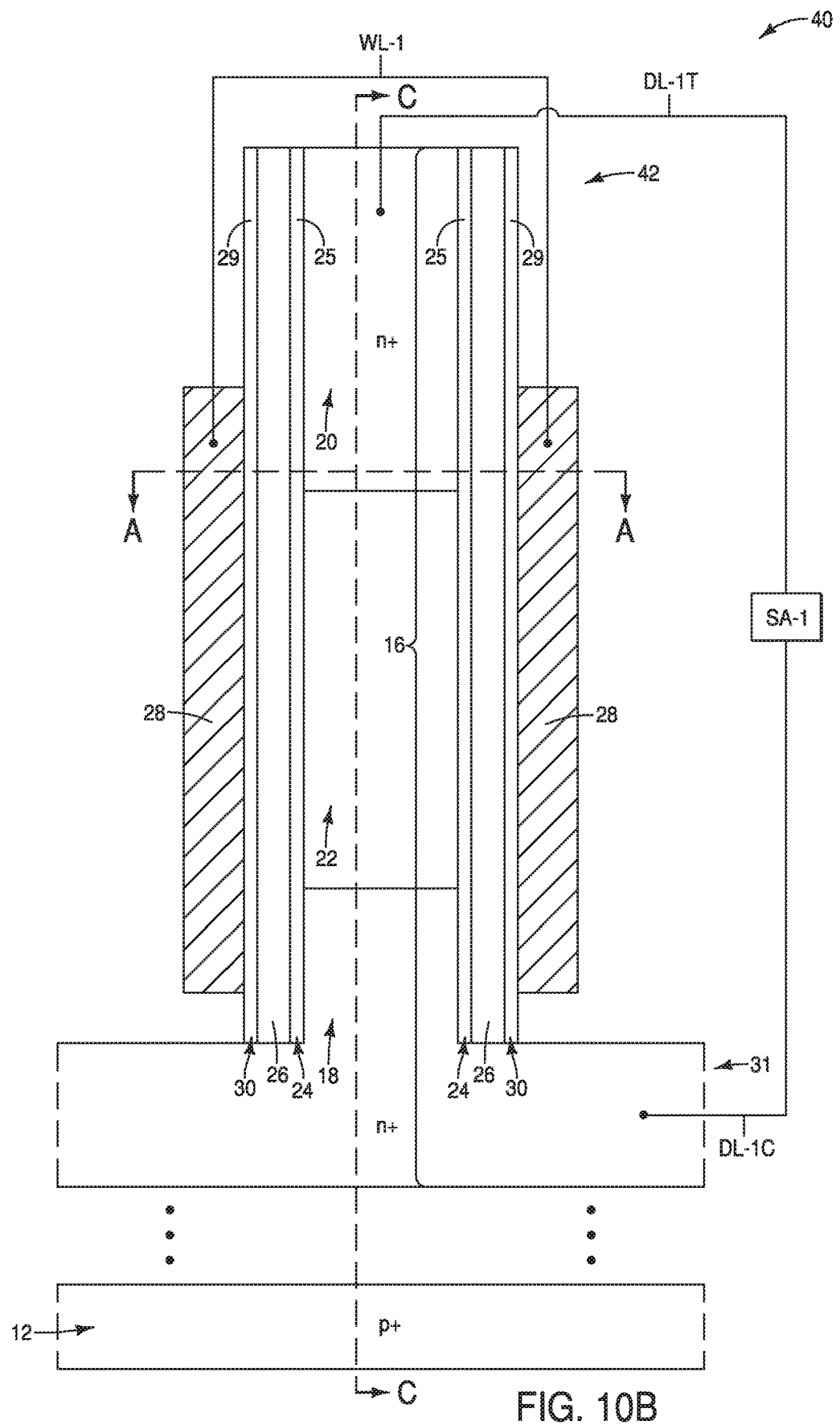
Figure 10C:
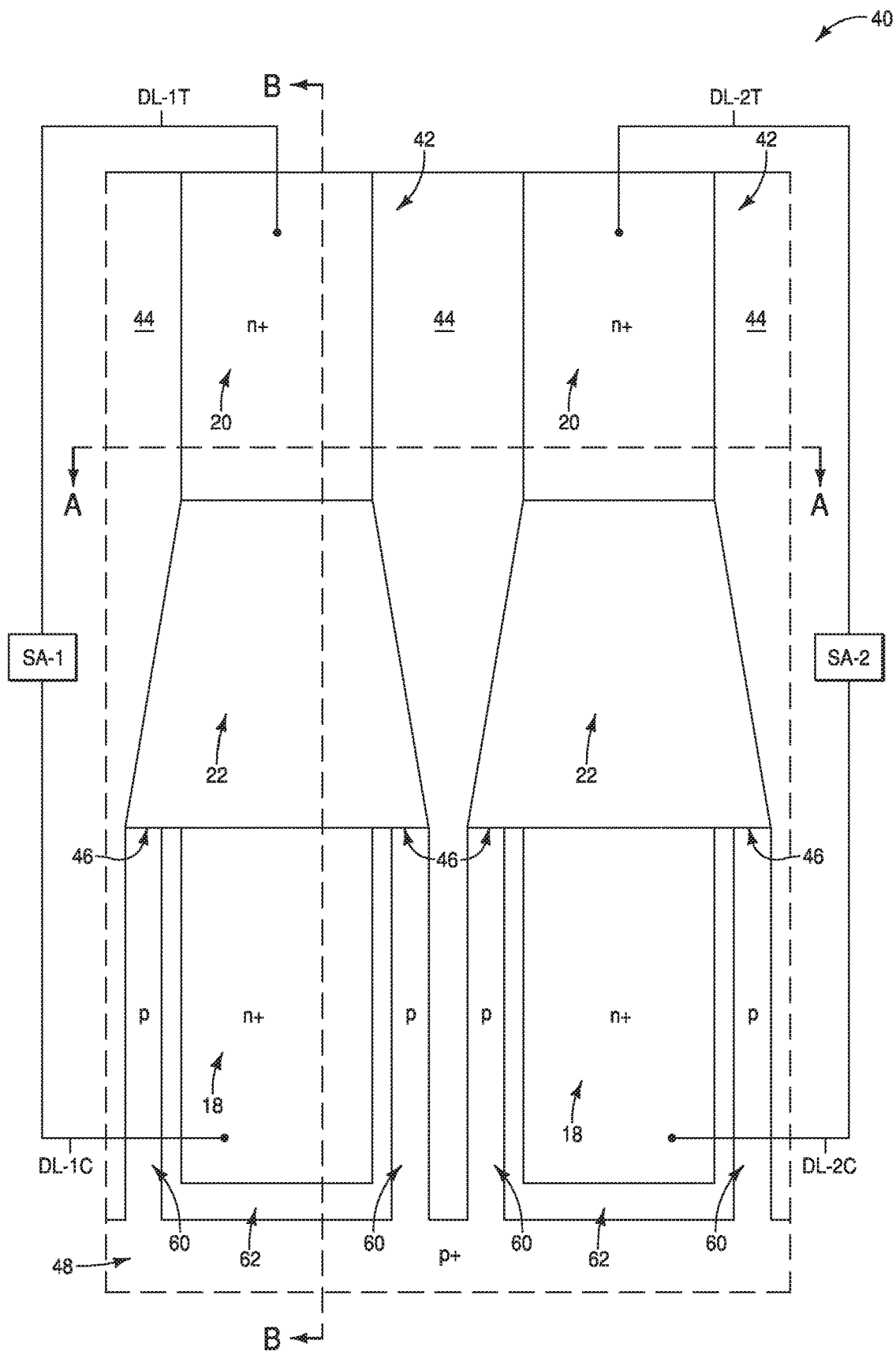

FIGS. 10A-10C show regions of a portion of a memory array 40 comprising memory cells 42. The memory cells comprise active regions 16 which include source/drain regions 18 and 20, and which include body regions 22 between the source/drain regions. The active regions 16 of the memory cells 42 may comprise a heterostructure configuration analogous to that described above with reference to FIG. 1 (i.e., one or both of the source/drain regions 18 may comprise a different semiconductor material than the body region 22), or not. In some embodiments, all of the regions 18, 20 and 22 of the memory cells 42 will comprise a same semiconductor composition as one another. For instance, all of the regions may comprise, consist essentially of, or consist of silicon (for instance, monocrystalline silicon), germanium, Si/Ge, etc.

The memory cells include the insulative regions 24 and 30, and the charge-storage material 26. One or both of the insulative regions 24 and 30 may comprise multiple different discrete compositions analogously to the configuration of FIG. 8; and in some embodiments the region 24 may be omitted analogously to the configuration of FIG. 9.

The adjacent memory cells 42 are spaced from one another by insulative material 44. The insulative material 44 may comprise any suitable composition(s); and in some embodiments may comprise, consist essentially of, or consist of silicon dioxide.

The body regions 22 are shown to extend laterally outwardly of the bottom source/drain regions (first source/drain regions) 18 along the cross-section of FIG. 10C. Accordingly, segments of the body regions 22 are laterally outward of the source/drain regions 18, with such segments being shelf portions 46 of the body regions.

A hole-reservoir 48 is beneath the first source/drain regions 18, and is vertically offset from the body regions 22. Extensions 60 pass from the hole-reservoir 48 to the shelf portions 46 of the body regions 22. Such extensions 60 may transfer holes from the hole-reservoir 48 to the body regions 22 to replenish holes within the body regions during injection of holes from the body regions to the charge-storage material 26.

In the illustrated embodiment, insulative liners 62 extend along sidewalls of the first source/drain regions 18, and also under the first source/drain regions 18. The extensions 60 are along the sidewalls of the first source/drain regions 18, and are spaced from the sidewalls by the insulative liners 62. The insulative liners 62 may comprise any suitable insulative composition(s); and in some embodiments may comprise, consist essentially of, or consist of silicon dioxide.

The hole-reservoir 48 and extensions 60 may comprise any suitable composition(s); and in some embodiments may comprise, consist essentially of, or consist of p-doped semiconductor material (e.g., p-doped silicon). Also, in some embodiments a metal may be provided under the reservoir 48 to reduce spreading resistance.

In the illustrated embodiment, the source/drain regions 18 and 20 are n-doped regions, and accordingly the memory cells 42 are n-channel devices. In other embodiments (not shown) the memory cells may be p-channel devices, and the reservoir may be utilized to provide electrons rather than holes.

The memory array 40 may be operated analogously to the memory array 34 described above with reference to FIG. 3.

The hole-recharge arrangements described herein relative to FIGS. 1-10 may enable rapid refresh of the memory cells during operations in which holes are injected into the charge-storage material 26 to erase data from the charge-storage material. For instance, in some embodiments the hole-recharge arrangements may enable refresh rates to exceed 20 nanoseconds (ns), and even to exceed 15 ns.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multi-chip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a memory cell with an active region which includes a first source/drain region, a second source/drain region, and a body region between the first and second source/drain regions. The first and second source/drain regions are n-doped regions. A charge-storage material is adjacent to the body region. A conductive gate is adjacent to the charge-storage material. A hole-recharge arrangement is configured to replenish holes within the body region during injection of holes from the body region to the charge-storage material. The hole-recharge arrangement includes a heterostructure active region having at least one source/drain region of a different composition than the body region, and/or the hole-recharge arrangement includes an extension coupling the body region with a hole-reservoir. A wordline is coupled with the conductive gate. A first comparative digit line is coupled with the first source/drain region. A second comparative digit line is coupled with the second source/drain region.

Some embodiments include a memory cell having an active region which includes a first source/drain region, a second source/drain region, and a body region between the first and second source/drain regions. The body region has a different semiconductor composition than at least one of the first and second source/drain regions to enable replenishment of carrier within the body region through inter-band tunneling between the body region and said at least one of the first and second source/drain regions. A charge-storage material is adjacent to the body region. A conductive gate material is adjacent to the charge-storage material.

Some embodiments include an integrated assembly having a memory cell comprising a vertically-extending active region which includes a first source/drain region, a second source/drain region, and a body region between the first and second source/drain regions. The body region comprises a different semiconductor composition than both of the first and second source/drain regions. The active region has a pair of opposing sidewalls along a cross-section. A first insulative region is along each of the opposing sidewalls. A charge-storage material is adjacent to the first insulative region. A second insulative region is adjacent to the charge-storage material. A conductive gate material is adjacent to the second insulative region. A first comparative digit line is coupled with the first source/drain region. A second comparative digit line is coupled with the second source/drain region. A portion of the active region overlapped by the conductive gate material is a gated portion of the active region. The semiconductor composition of the body region transitions to the semiconductor composition of one of the source/drain regions along a first transition region. The first transition region is within the gated portion of the active region. The semiconductor composition of the body region transitions to the semiconductor composition of the other of the source/drain regions along a second transition region. The second transition region is within the gated portion of the active region.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
   a memory cell comprising an active region which includes a first source/drain region, a second source/drain region, and a body region between the first and second source/drain regions; the first and second source/drain regions being n-doped regions;
   a charge-storage material adjacent the body region;
   a conductive gate adjacent the charge-storage material;
   a hole-recharge arrangement configured to replenish holes within the body region during injection of holes from the body region to the charge-storage material; the hole-recharge arrangement including a heterostructure active region comprising at least one of the first and second source/drain regions being of a different composition than the body region, and/or the hole-recharge arrangement including an extension coupling the body region with a hole-reservoir;
   a wordline coupled with the conductive gate;
   a first comparative digit line coupled with the first source/drain region; and
   a second comparative digit line coupled with the second source/drain region.

2. The integrated assembly of claim 1 wherein:
the memory cell is one of many substantially identical memory cells within a memory array;
the wordline is one of many substantially identical wordlines;
the first and second comparative digit lines are together a paired set of first and second comparative digit lines, with the paired set being one of many substantially identical paired sets of first and second comparative digit lines; and
each of the memory cells is uniquely addressed through a combination of one of the wordlines and one of the paired sets of first and second comparative digit lines.

3. The integrated assembly of claim 1 comprising the hole-reservoir proximate the memory cell, and comprising the extension passing from the body region to the hole-reservoir.

4. The integrated assembly of claim 3 wherein:
the body region is vertically offset from the hole-reservoir;
the first source/drain region is between the hole-reservoir and the body region;
the body region extends laterally outwardly of the first source/drain region along a cross-section; a segment of the body region which is laterally outward of the source/drain region being a shelf portion of the body region;
an insulative liner extends along sidewalls of the first source/drain region along the cross-section; and
the extension passes from the hole reservoir and to the shelf portion of the body region; the extension being adjacent the insulative liner along one of the sidewalls of the first source/drain region, and being spaced from said one of the sidewalls of the first source/drain region by at least the insulative liner along said one of the sidewalls of the first source/drain region.

5. The integrated assembly of claim 4 wherein the hole-reservoir and the extension are p-type doped semiconductor material.

6. The integrated assembly of claim 5 wherein the semiconductor material comprises silicon.

7. The integrated assembly of claim 1 comprising the heterostructure active region, and wherein the body region comprises a different semiconductor composition than both of the first and second source/drain regions.

8. The integrated assembly of claim 7 comprising an abrupt transition from the semiconductor composition of the body region to the semiconductor composition of at least one of the source/drain regions.

9. The integrated assembly of claim 7 comprising an abrupt transition from the semiconductor composition of the body region to the semiconductor composition of both of the source/drain regions.

10. The integrated assembly of claim 7 comprising a graded transition from the semiconductor composition of the body region to the semiconductor composition of at least one of the source/drain regions.

11. The integrated assembly of claim 7 comprising an abrupt transition from the semiconductor composition of the body region to the semiconductor composition of one of the source/drain regions, and comprising a graded transition from the semiconductor composition of the body region to the semiconductor composition of the other of the source/drain regions.

12. The integrated assembly of claim 7 wherein the first and second source/drain regions comprise different semiconductor compositions relative to one another.

13. The integrated assembly of claim 7 wherein the first and second source/drain regions comprise a same semiconductor composition.

14. The integrated assembly of claim 7 wherein the body region comprises germanium with or without silicon; wherein the first and second source/drain regions comprise silicon with or without germanium; and wherein a germanium concentration within the body region is higher than any germanium concentration of either of the first and second source/drain regions.

15. A memory cell, comprising an active region which includes a first source/drain region, a second source/drain region, and a body region between the first and second source/drain regions;
the body region comprising a different semiconductor composition than at least one of the first and second source/drain regions to enable replenishment of carrier within the body region through inter-band tunneling between the body region and said at least one of the first and second source/drain regions;
a charge-storage material adjacent the body region; and
a conductive gate material adjacent the charge-storage material.

16. The memory cell of claim 15 wherein the charge-storage material comprises charge-trapping material.

17. The memory cell of claim 16 wherein the charge-trapping material comprises silicon nitride.

18. The memory cell of claim 15 wherein the charge-storage material comprises polycrystalline silicon.

19. The memory cell of claim 15 wherein the charge-storage material comprises metal.

20. The memory cell of claim 15 wherein the charge-storage material comprises silicon oxynitride.

21. The memory cell of claim 15 further comprising an insulative region between the charge-storage material and the body region.

22. The memory cell of claim 21 wherein the insulative region is a single homogenous composition.

23. The memory cell of claim 21 wherein the insulative region is a laminate of two or more compositions.

24. The memory cell of claim 15 wherein the insulative region is a first insulative region, and further comprising a second insulative region between the charge-storage material and the conductive gate.

25. The memory cell of claim 15 wherein the first and second source/drain regions comprise different semiconductor compositions relative to one another.

26. The memory cell of claim 15 wherein the first and second source/drain regions comprise a same semiconductor composition.

27. The memory cell of claim 15 wherein the body region comprises a different semiconductor composition than both of the first and second source/drain regions.

28. The memory cell of claim 27 wherein the body region comprises germanium with or without silicon; wherein the first and second source/drain regions comprise silicon with or without germanium; and wherein a germanium concentration within the body region is higher than any germanium concentration within either of the first and second source/drain regions.

29. The memory cell of claim 28 wherein the germanium concentration within the body region is within a range of from about 10 atomic percent to about 100 atomic percent.

30. The memory cell of claim 28 wherein the body region comprises both silicon and germanium.

31. The memory cell of claim 28 comprising an abrupt transition from the semiconductor composition of the body region to the semiconductor composition of at least one of the source/drain regions.

32. The memory cell of claim 28 comprising an abrupt transition from the semiconductor composition of the body region to the semiconductor composition of both of the source/drain regions.

33. The memory cell of claim 28 comprising a graded transition from the semiconductor composition of the body region to the semiconductor composition of at least one of the source/drain regions.

34. The memory cell of claim 28 comprising an abrupt transition from the semiconductor composition of the body region to the semiconductor composition of one of the source/drain regions, and comprising a graded transition from the semiconductor composition of the body region to the semiconductor composition of the other of the source/drain regions.

35. The memory cell of claim 34 wherein a portion of the active region overlapped by the conductive gate material is a gated portion of the active region; wherein the abrupt transition is within the gated portion of the active region; and wherein a part of the graded transition is within the gated portion of the active region and another part of the graded transition is not within the gated portion of the active region.

36. An integrated assembly, comprising:
a memory cell comprising a vertically-extending active region which includes a first source/drain region, a second source/drain region, and a body region between the first and second source/drain regions; the body region comprising a different semiconductor composition than both of the first and second source/drain regions; the active region having a pair of opposing sidewalls along a cross-section;
a first insulative region along each of the opposing sidewalls;
a charge-storage material adjacent the first insulative region;
a second insulative region adjacent the charge-storage material;
a conductive gate material adjacent the second insulative region;
a first comparative digit line coupled with the first source/drain region;
a second comparative digit line coupled with the second source/drain region;
a portion of the active region overlapped by the conductive gate material being a gated portion of the active region;
the semiconductor composition of the body region transitioning to the semiconductor composition of one of the source/drain regions along a first transition region; the first transition region being within the gated portion of the active region; and
the semiconductor composition of the body region transitioning to the semiconductor composition of the other of the source/drain regions along a second transition region; the second transition region being within the gated portion of the active region.

37. The integrated assembly of claim 36 wherein the first and second source/drain regions comprise different semiconductor compositions relative to one another.

38. The integrated assembly of claim 36 wherein the first and second source/drain regions comprise a same semiconductor composition.

39. The integrated assembly of claim 36 wherein the body region comprises germanium with or without silicon; wherein the first and second source/drain regions comprise silicon with or without germanium; and wherein a germanium concentration within the body region is higher than any germanium concentration of either of the first and second source/drain regions.

40. The integrated assembly of claim 36 wherein:
the memory cell is one of many substantially identical memory cells within a memory array;
the conductive gate material is coupled with a wordline which is one of many substantially identical wordlines;
the first and second comparative digit lines are together a paired set of first and second comparative digit lines, with the paired set being one of many substantially identical paired sets of first and second comparative digit lines; and
each of the memory cells is uniquely addressed through a combination of one of the wordlines and one of the paired sets of first and second comparative digit lines.

* * * * *